United States Patent
Lane et al.

(10) Patent No.: US 9,219,483 B1
(45) Date of Patent: Dec. 22, 2015

(54) INTEGRATED CIRCUIT FLOORPLANS

(71) Applicant: Altera Corporation, San Jose, CA (US)

(72) Inventors: Christopher F. Lane, San Jose, CA (US); Giles V. Powell, Alameda, CA (US); Jeffrey Tyhach, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/198,524

(22) Filed: Mar. 5, 2014

(51) Int. Cl.
*H03K 19/177* (2006.01)
*H03K 19/08* (2006.01)

(52) U.S. Cl.
CPC ........................................ *H03K 19/08* (2013.01)

(58) Field of Classification Search
CPC .................. H03K 19/17736; H03K 19/17744
USPC ........................................................ 326/38–41
See application file for complete search history.

(56) References Cited

U.S. PATENT DOCUMENTS

| | | | |
|---|---|---|---|
| 5,682,322 A | 10/1997 | Boyle et al. | |
| 7,961,478 B2 | 6/2011 | Cousin | |
| 8,521,085 B2 | 8/2013 | Rofougaran | |
| 2008/0231317 A1* | 9/2008 | Cashman | 326/41 |

* cited by examiner

*Primary Examiner* — Don Le

(57) ABSTRACT

An integrated circuit is disclosed. The integrated circuit may include an interface circuit region and logic circuitry region. The interface circuit region includes interface circuits that transfers signals in and out of the integrated circuit. The logic circuitry region includes logic circuitry that is configured to implement a logic function. The logic circuitry region surrounds the interface circuit region from at least two sides, from at least three sides, or from all four sides.

19 Claims, 8 Drawing Sheets

INTEGRATED CIRCUIT FLOORPLANS

BACKGROUND

A typical integrated circuit floorplan may have core logic circuitry formed in the center region of the integrated circuit and input-output circuitry (i.e., interface circuitry) formed along the periphery of the integrated circuit. However, such conventional floorplan designs exhibit drawbacks, one of which includes inefficient usage of corner regions.

Most integrated circuit dies are relatively large in order to accommodate a large core region. The interface circuitry, which generally occupies a relatively small floorplan area, occupies only a portion of the corner regions on the integrated circuit. Therefore, the corner regions on the integrated circuit may not be fully utilized.

In addition to that, such floorplans may not be optimal for designs with strict timing requirements. For example, there may be a significant distance between an input-output circuit located at a corner of the peripheral region and the corresponding logic resource in the core region. The large distance between the two circuits can result in timing violations as critical timing pathways may not be able to meet timing constraints (especially in memory interfacing applications).

Another known drawback with such floorplans is the resource contention between the input-output circuitry at the peripheral region and the logic circuitry at corners of the core region.

SUMMARY

Embodiments described herein include integrated circuit floorplans. It should be appreciated that the embodiments can be implemented in numerous ways, such as an apparatus, a system, or a device. Several embodiments are described below.

In one embodiment, an integrated circuit that includes an interface circuit region and a logic region is disclosed. The interface circuit region may include interface circuitry that is utilized for transferring signals in and out of the integrated circuit. The logic region may include logic circuitry that implements a logic function. The logic region surrounds at least two sides of the interface circuit region.

In another embodiment, an integrated circuit having at least one corner edge is disclosed. The integrated circuit includes an interface circuit and logic circuitry. A portion of the interface circuit may be formed at the corner edge of the integrated circuit and the logic circuitry is formed along at least two sides of the interface circuit.

In an alternative embodiment, an integrated circuit is disclosed. The integrated circuit includes an interface circuit and logic circuitry. In this embodiment, the logic circuitry wraps around all sides of the interface circuit.

Further features of the invention, its nature and various advantages will be more apparent from the accompanying drawings and the following detailed description of the preferred embodiments.

DETAILED DESCRIPTION

The following embodiments describe integrated circuit floorplans. It will be obvious, however, to one skilled in the art, that the present exemplary embodiments may be practiced without some or all of these specific details. In other instances, well-known circuit components have not been described in detail in order not to unnecessarily obscure the present embodiments.

Figure 1:
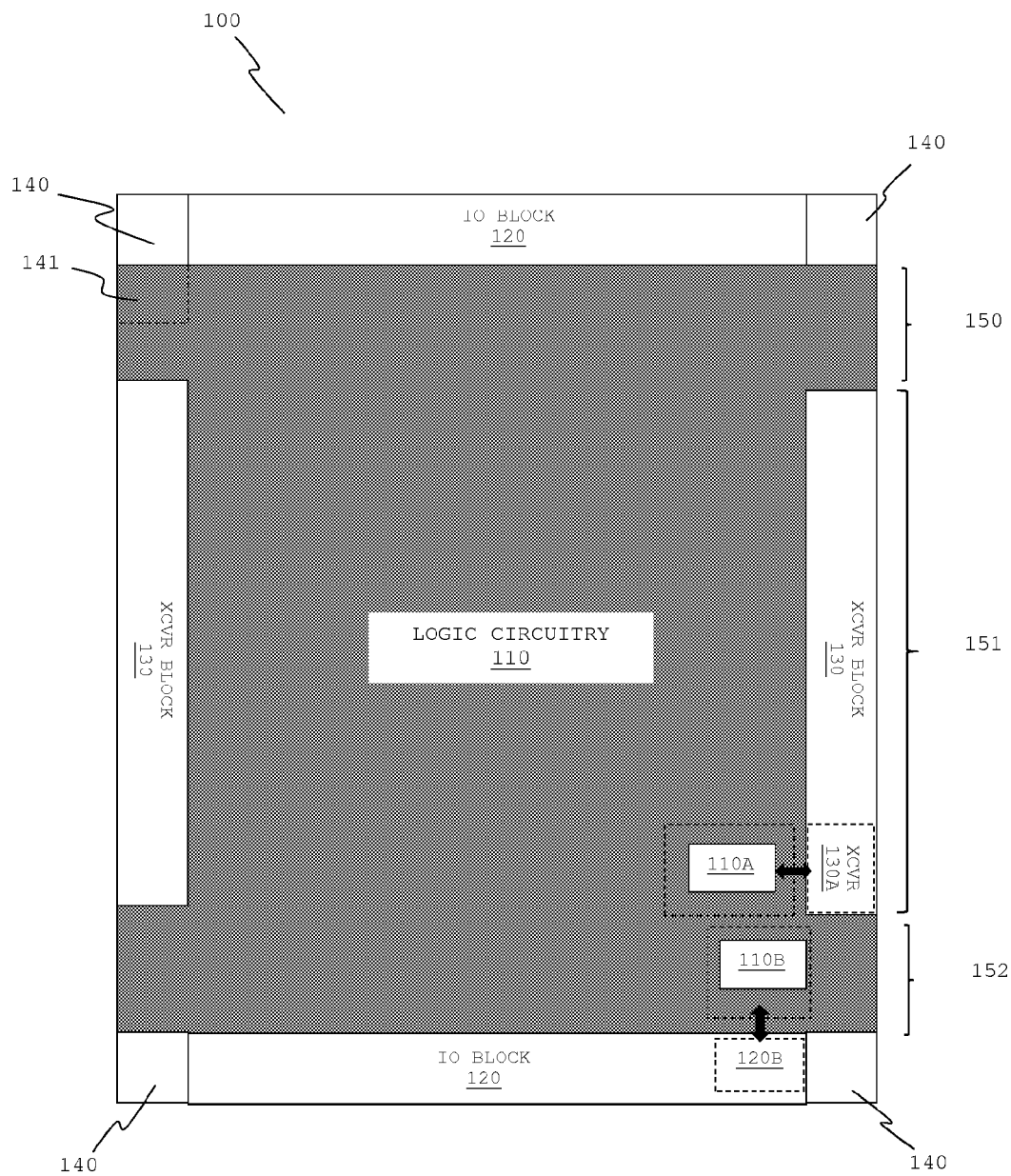
FIG. 1 shows an illustrative floorplan of an integrated circuit with logic circuitry region that surrounds three sides of a transceiver block in accordance with one embodiment of the present invention.

FIG. 1, meant to be illustrative and not limiting, shows a floorplan of an integrated circuit 100 with logic circuitry region 110 surrounding three sides of transceiver block 130 in accordance with one embodiment of the present invention. In one embodiment, integrated circuit 100 may be an application specific integrated circuit (ASIC) device, an application standard specific product (ASSP) device or a programmable logic device (PLD). It should be appreciated that ASIC and ASSP devices perform a fixed and dedicated function whereas a PLD device may be programmable to perform various functions. An example of a PLD device may be a field programmable gate array (FPGA) device.

Integrated circuit 100 may form a part of a wireless system, a wired system, or other types of system. Therefore, integrated circuit 100 may include circuits dedicated to perform various functions that define the system.

Referring still to FIG. 1, logic circuitry region 110 may be utilized for performing core functions of integrated circuit 100. Logic circuitry 110 is formed in the center region of integrated circuit 100. Logic circuitry region 110 may include circuits that may be adapted to perform functions that define integrated circuit 100. For example, logic circuitry region 110 may include memory controller elements that may perform memory device addressing and processing of information retrieved from a memory device when integrated circuit 100 is a memory controller device. Alternatively, logic circuitry region 110 may include programmable logic elements that may be programmed according to user command when integrated circuit 100 is a PLD.

Signals transmitted from logic circuitry region 110 may be transferred out of integrated circuit 100 through an input-output (IO) circuit within IO block 120 or a transceiver circuit within transceiver block 130. Accordingly, signals received from an external device (i.e., external to integrated circuit 100) may be transmitted to logic circuitry region 110 through an IO circuit within IO block 120 or a transceiver circuit within transceiver block 130. Therefore, IO blocks 120 and transceiver blocks 130 may be known as external interfacing circuitry of integrated circuit 100. Transceiver blocks 130 and IO blocks 120 may be located at the perimeter region of integrated circuit 100. In the exemplary embodiment of FIG. 1, IO blocks 120 occupy the top and bottom regions whereas transceiver blocks 130 occupy the left and right regions of integrated circuit 100. It should be appreciated that the terms, "top," "bottom," "left" and "right" as used herein are not intended to limit the described embodiments to any particular orientation.

In one exemplary embodiment, transceiver blocks 130 may include twelve transceiver circuits (e.g., transceivers 130A) and IO blocks 120 may include three hundred IO circuits (e.g., IO circuits 120B). It should be appreciated that the number of IO circuits within each IO block 120 and the number of transceiver circuits within each transceiver block 130 may vary depending on the requirements of a particular design. Accordingly, the arrangement of IO blocks 120 and transceiver blocks 130 may vary depending on the design.

Integrated circuit 100 may further include a plurality of corner circuits 140. In one embodiment, corner circuits 140 may include power management circuitry or phase-lock loop (PLL) circuitry. In the embodiment of FIG. 1, corner circuits 140 are located at every corner of integrated circuit 100. The size of the corner area may depend on at least two factors: (i) the size of IO blocks 120, and (ii) the size of transceiver blocks 130.

Integrated circuit 100 may further include routing pathways (not shown) that surrounds the perimeter of logic circuitry region 110. Routing pathways may be utilized to transfer signals between logic circuitry region 110 and respective IO circuits within IO block 120 or between logic circuitry region 110 and respective transceiver circuits within transceiver block 130. The number of routing pathways available in integrated circuit 100 may depend on the number of IO circuits and transceiver circuits in the respective IO 120 and transceiver 130 blocks.

In addition to that, the number of routing pathways may also depend on the manner in which logic circuitry region 110 surrounds IO blocks 120 or transceiver blocks 130. It should be appreciated that additional routing pathways may be needed when logic circuitry region 110 may not directly access IO blocks 120 or transceiver blocks 130. However, in the embodiment of FIG. 1, logic circuitry region 110 may be able to directly access IO blocks 120 and transceiver blocks 130.

It should be noted in this context that within the framework of the present invention, circuit components, blocks and structures are coupled to one another in that they are directly interconnected (in an electrically conductive manner) or are interconnected via further components. In other words, within the framework of the present invention, coupled circuit components, blocks and structures are understood to mean such circuit components, blocks and structures which are interconnected both indirectly and directly by using electrically conductive connections. For example, two components may be (indirectly) coupled to one another via a driver circuit, a buffer, a resistor, a bus structure, a signal line, or another component.

As shown in FIG. 1, the shape of logic circuitry region 110 resembles a cross-section of an I-beam structure. The I-beam shaped logic circuitry region 110 may be referred by its different segments, i.e., web portion 151 that is coupled by two flange portions 150 and 152. In one embodiment, the I-beam shaped logic circuitry region 110 may be preferred when the area needed for IO blocks 120 is greater than the area needed for transceiver blocks 130.

Still referring to FIG. 1, the I-beam shaped logic circuitry region 110 surrounds three sides of each transceiver block 130. The I-beam shaped logic circuitry region 110 may be located directly adjacent to the IO blocks 120 and coupled with one side of each IO blocks 120. An advantage of the I-beam shaped logic circuitry region 110 is having relatively short signal transmission pathways (i.e., pathways for signal transmissions between IO circuits within IO block 120 and circuits within logic circuitry region 110). In one exemplary embodiment, when the top left corner circuit 140 is designed to include an IO circuit (i.e., similar to IO circuit within IO block 120, the IO circuit may still be able to communicate with the portion of logic circuitry region 110 that is located directly below the top left IO circuit 120 (shown in FIG. 1 as regions enclosed in dotted rectangle 141), hence maintaining a relatively short signal transmission pathway.

Furthermore, the I-beam shaped logic circuitry region 110 may prevent contentions between two different circuit blocks (e.g., IO block 120 and transceiver block 130) for a portion of logic circuitry region 110 that is nearest to the respective circuit blocks in order to maintain a short signal transmission pathway. As shown in the embodiment of FIG. 1, logic circuitry 110A may communicate with the transceiver circuit 130A within transceiver block 130 and logic circuitry 110B may communicate with IO circuit 120B within IO block 120.

Figure 2:
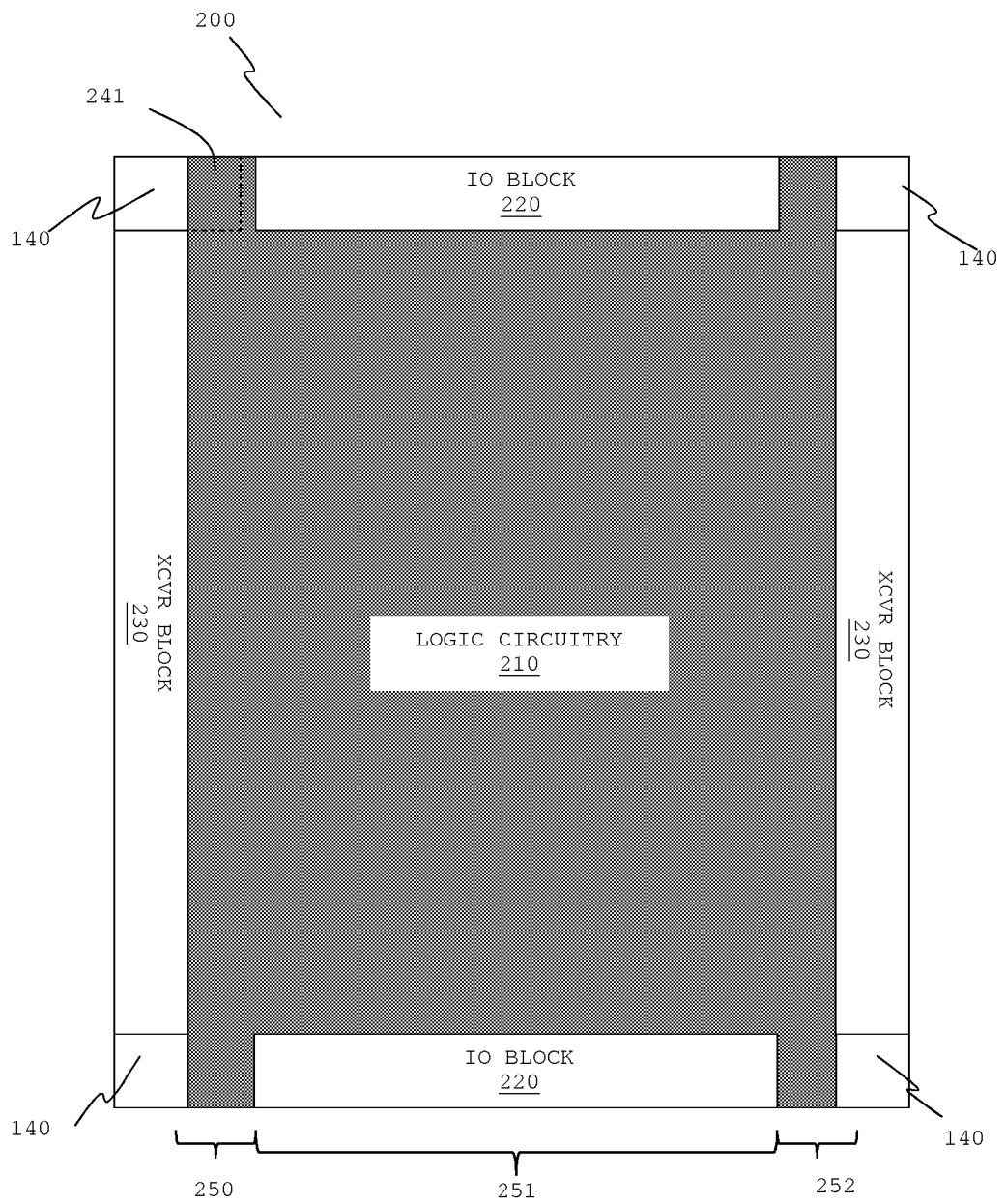
FIG. 2 shows an illustrative integrated circuit having logic circuitry region that surrounds three sides of each input-output block in accordance with one embodiment of the present invention.

FIG. 2, meant to be illustrative and not limiting, illustrates an integrated circuit having logic circuitry region 210 that surrounds three sides of IO blocks 220 in accordance with one embodiment of the present invention. Integrated circuit 200 may have transceiver blocks 230 that may occupy a relatively larger area than transceiver blocks 130 of FIG. 1. Furthermore, integrated circuit 200 includes IO blocks 220 that occupy a relatively smaller area than IO blocks 120 of FIG. 1. IO blocks 220, transceiver blocks 230 and logic circuitry region 210 may share similarities with IO blocks 120, transceiver blocks 130 and logic circuitry region 110 of FIG. 1, respectively, and as such, specific details that have been described above will not be repeated herein for the sake of brevity.

In one embodiment, the shape of logic circuitry region 210 resembles a cross-section of an H-beam structure. Similar to the I-beam shaped logic circuitry region 110 of FIG. 1, the H-beam shaped logic circuitry region 210 may be defined by its different segments, i.e., web portion 251 and two flange portions 250 and 252. The H-beam shaped logic circuitry region 210 may be preferred when the total area of transceiver blocks 230 is greater than that of IO blocks 230.

Still referring to FIG. 2, the H-beam shaped logic circuitry region 210 may surround three sides of the respective IO blocks 220. The H-beam shaped logic circuitry 210 is formed directly adjacent to the transceiver block 230. Therefore, each transceiver circuit within transceiver block 230 may have an option to couple with a portion of logic circuitry region 110 with an identical shortest transmission distance.

Similar to integrated circuit 100 of FIG. 1, integrated circuit 200 may also have corner circuits 140 that are located at every corner of integrated circuit 200. Corner circuits 140 may be similar to corner circuits 140 of FIG. 1. In the embodiment of FIG. 2, corner circuit 140 may be able to communicate with the portion of logic circuitry region 220 that is located directly adjacent to corner circuits 140. For example, the top left most corner circuit 140 may be able to communicate with a portion of logic circuitry 220 that is enclosed in dotted box 241.

Figure 3:
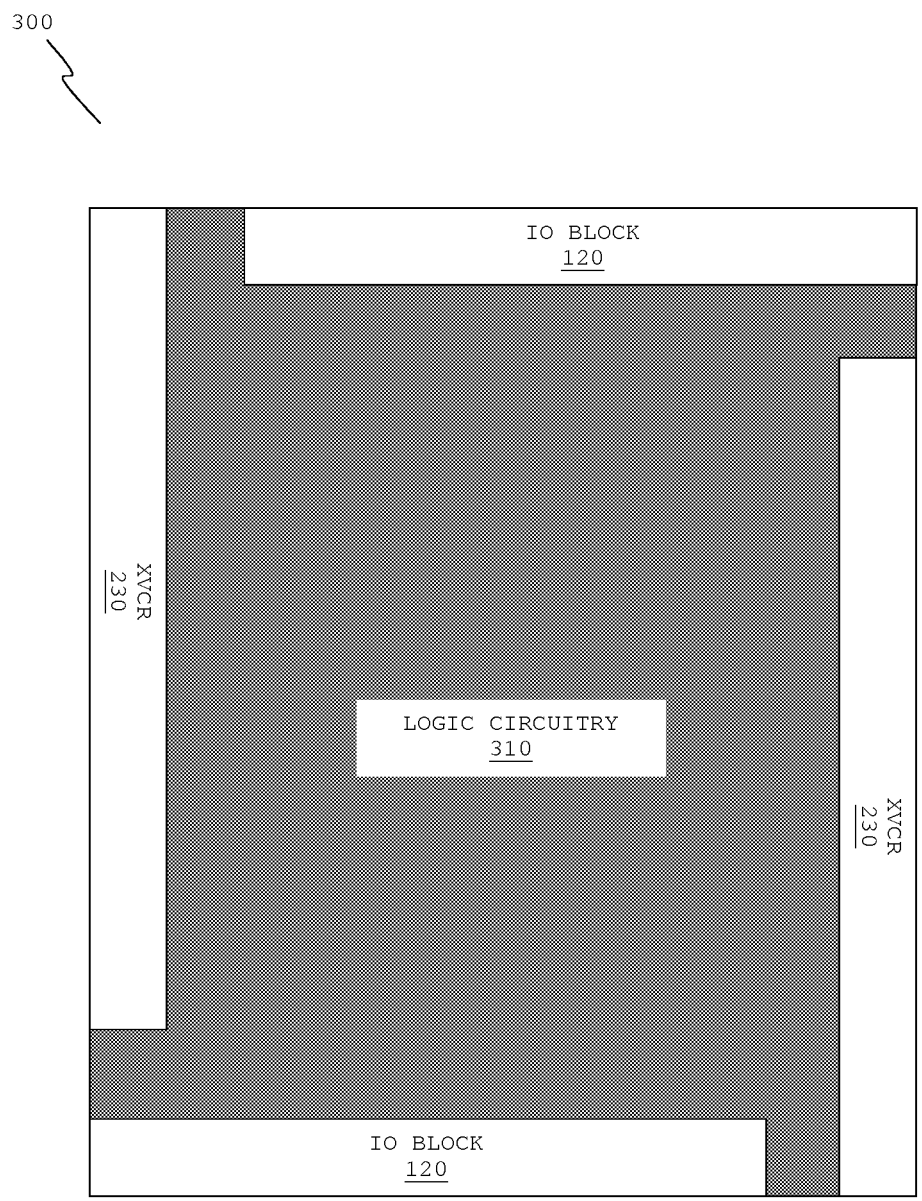
FIG. 3 shows an illustrative integrated circuit having logic circuitry region wrapped around two sides of each input-output and transceiver block in accordance with one embodiment of the present invention.

FIG. 3, meant to be illustrative and not limiting, illustrates an integrated circuit having logic circuitry region 310 wrapped around two sides of IO blocks 120 and transceiver blocks 230 in accordance with one embodiment of the present invention. As shown in the example of FIG. 3, a portion of IO blocks 120 and transceiver blocks 230 (i.e., specifically edges of IO blocks 120 and transceiver blocks 230) are formed on corner edges of integrated circuit 300. Transceiver blocks 230 and IO blocks 120 may be similar to transceiver blocks 230 of FIG. 2 and IO blocks 120 of FIG. 1, respectively. Logic circuitry region 310 has a different shape compared to logic circuitry region 110 of FIG. 1 or logic circuitry region 210 of FIG. 2. As shown in the embodiment of FIG. 3, logic circuitry region 310 is formed along at least two sides IO blocks 120 and transceiver blocks 230. In one embodiment, the shape of logic circuitry region 310 resembles a hybrid IH-beam structure. Such hybrid IH-beam shaped logic circuitry 310 may be preferred when there are no corner circuits (e.g., corner circuits 140 of FIGS. 1 and 2). Furthermore, IO blocks 120 and transceiver blocks 230 may be placed at the corners of integrated circuit 300.

Figure 4:
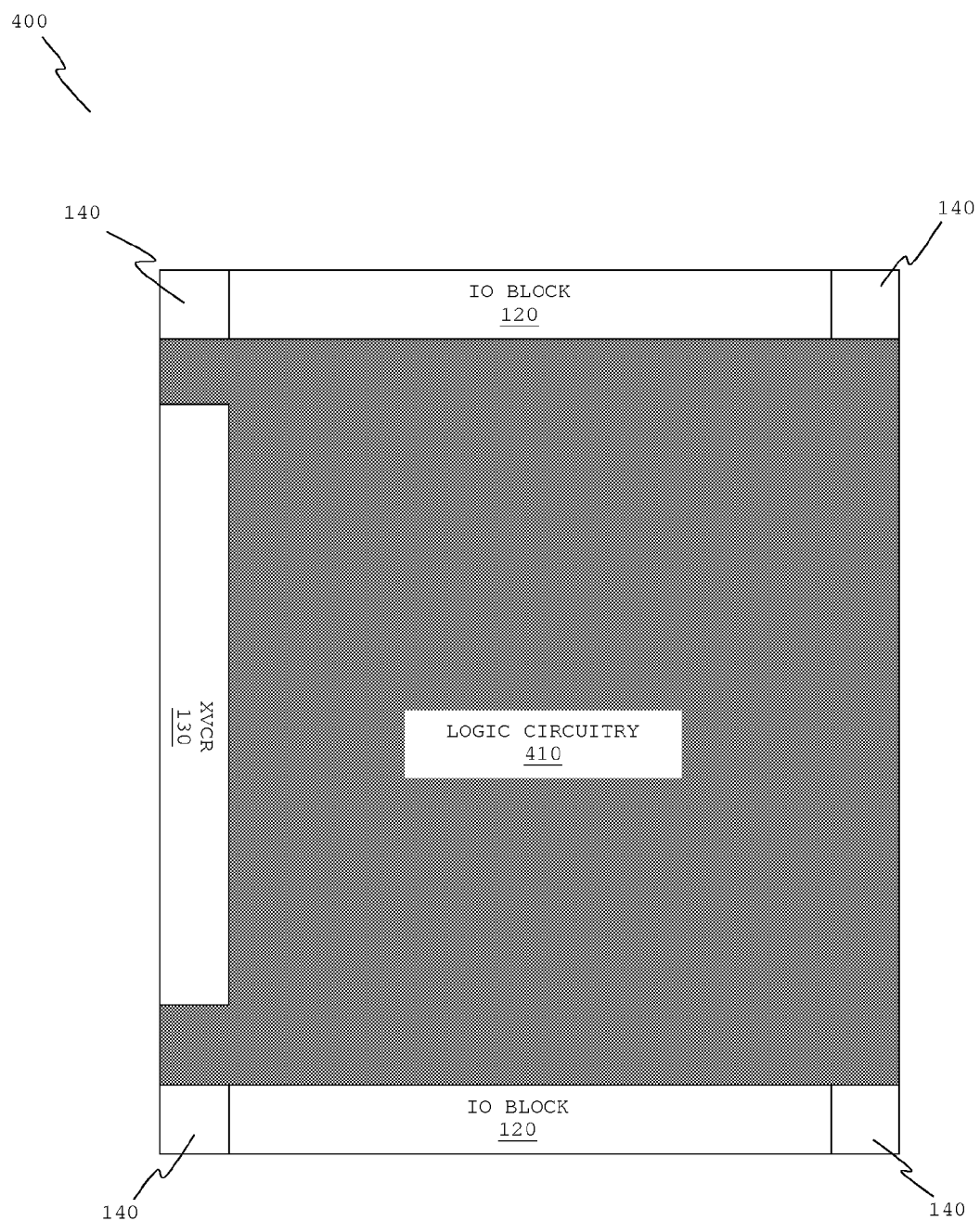
FIG. 4 shows an illustrative integrated circuit with one transceiver block in accordance with one embodiment of the present invention.

FIG. 4, meant to be illustrative and not limiting, illustrates an integrated circuit having only one transceiver block 130 in accordance with one embodiment of the present invention. Integrated circuit 400 may be similar to integrated circuit 100 of FIG. 1, with the exception of having transceiver block 130 on only one side only of integrated circuit 400 (e.g., the left side of integrated circuit 400). Therefore, logic circuitry region 410 may be shaped similar to a "U". Such U-shaped logic circuitry region 410 may be used when there are relatively few transceivers on an integrated circuit. In the embodiment of FIG. 4, the U-shaped logic circuitry region 410 surrounds three sides of transceiver block 130 and couples with one side of IO blocks 120.

Figure 5:
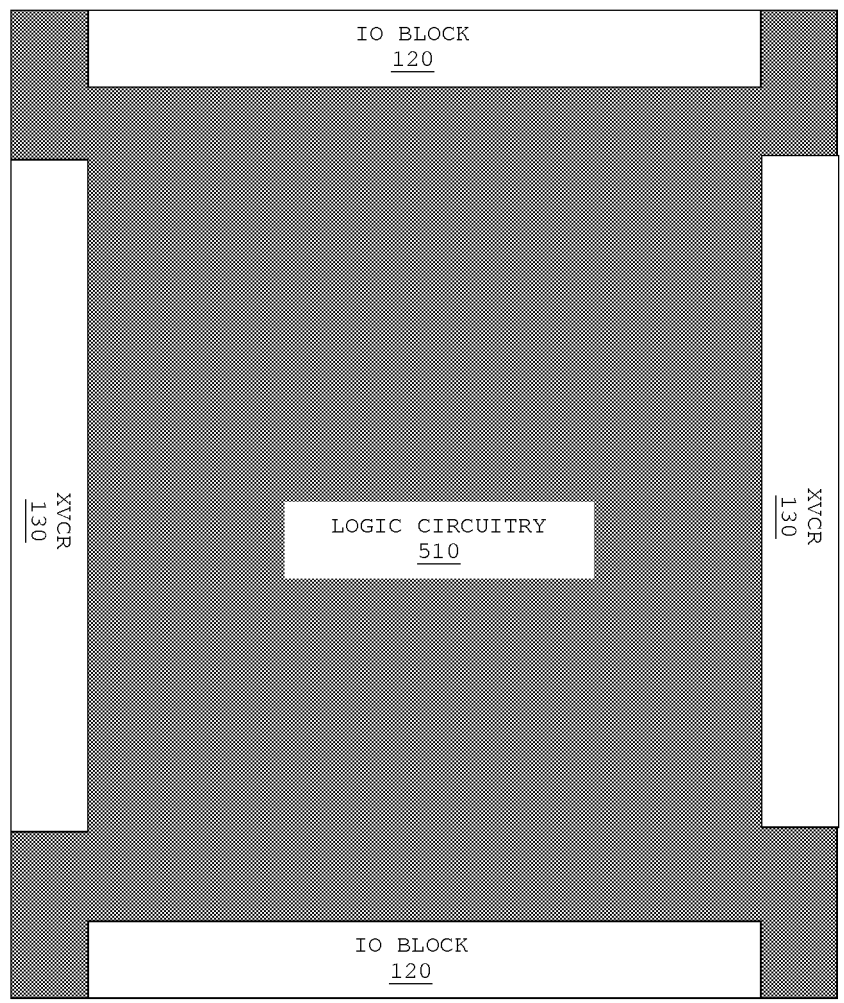
FIG. 5 shows an illustrative integrated circuit having logic circuitry region that extends to the corner-edges of the integrated circuit in accordance with one embodiment of the present invention.

FIG. 5, meant to be illustrative and not limiting, illustrates an integrated circuit having logic circuitry region that extends all the way into corner circuits in accordance with one embodiment of the present invention. Integrated circuit 500 may be similar to integrated circuit 100 of FIG. 1, with the exception of logic circuitry region 510 that extends into the area where corner circuits 140 are located in FIG. 1. Such a structure may be utilized when a larger amount of area is needed for logic circuitry region 510. In the embodiment of FIG. 5, logic circuitry region 510 surrounds three sides of respective transceiver blocks 130 and three sides of respective IO blocks 120.

Figure 6:
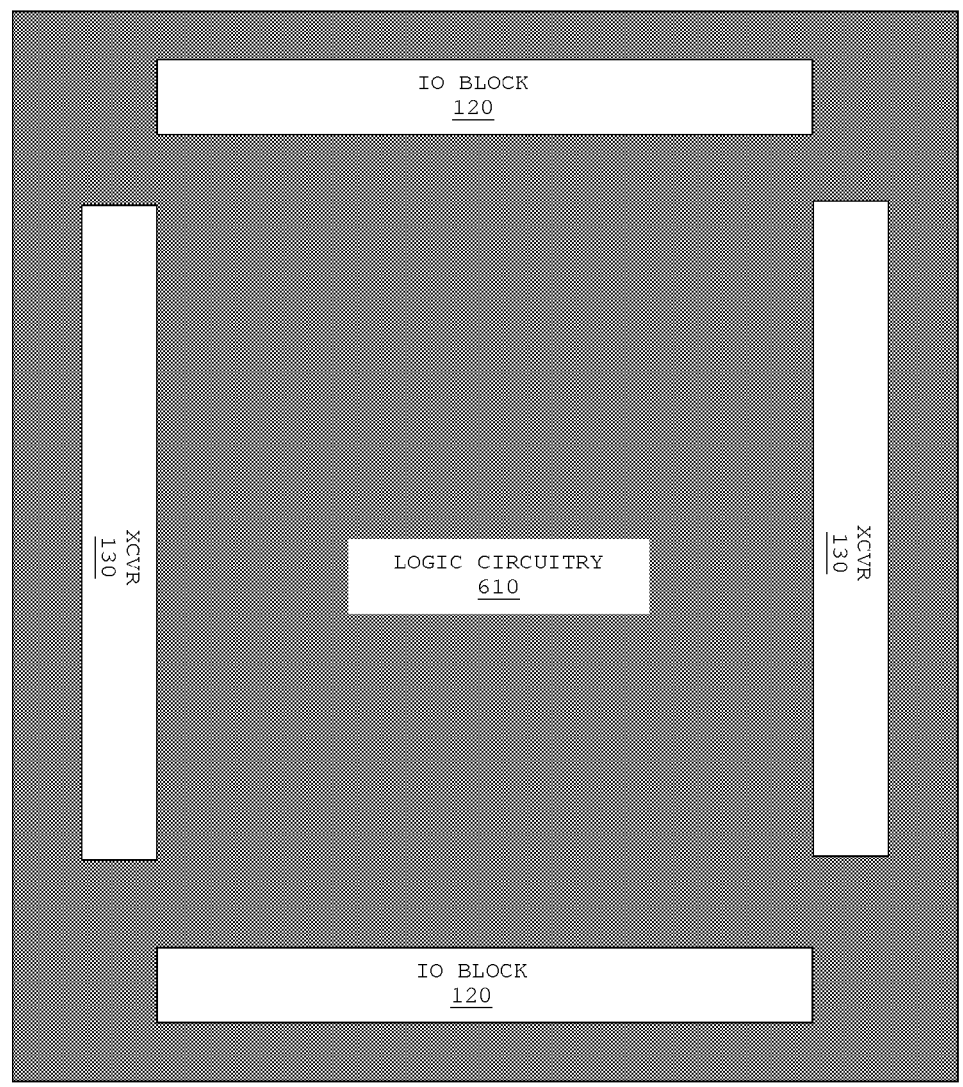
FIG. 6 shows an illustrative integrated circuit with transceiver blocks and input-output blocks surrounded by logic circuitry region in accordance with one embodiment of the present invention.

FIG. 6, meant to be illustrative and not limiting, illustrates an integrated circuit with transceiver blocks and IO blocks surrounded by logic circuitry region in accordance with one embodiment of the present invention. Integrated circuit 600 differs from integrated circuit 100 of FIG. 1 with respect to the shape of logic circuitry 610. Furthermore, integrated circuit 600 may be an extended version of integrated circuit 500 of FIG. 1, where the logic circuitry region 610 now is enlarged version compared to logic circuitry region 510 of FIG. 5. In the embodiment of FIG. 6, logic circuitry region 610 completely surrounds all four sides of transceiver blocks 130 and IO blocks 120. Such a structure may be utilized when integrated circuit 500 of FIG. 5 requires large logic circuitry regions.

In another embodiment, IO blocks 120 may be located at perimeter of integrated circuit 600 (unlike the one shown in FIG. 6) and transceiver blocks 130 remains within integrated circuit 600 as shown in FIG. 6. Therefore, logic circuitry region 610 may surround four edges of transceiver blocks 130 and two edges of IO blocks 120. Alternatively, transceiver blocks 130 may be located at perimeter of integrated circuit 600 (unlike the earlier embodiment and the one shown in FIG. 6) and IO blocks 120 remains within integrated circuit 600 as shown in FIG. 6. Therefore, logic circuitry region 610 may surround four edges of IO blocks 120 and only two edges of transceiver blocks 130.

Figure 7:
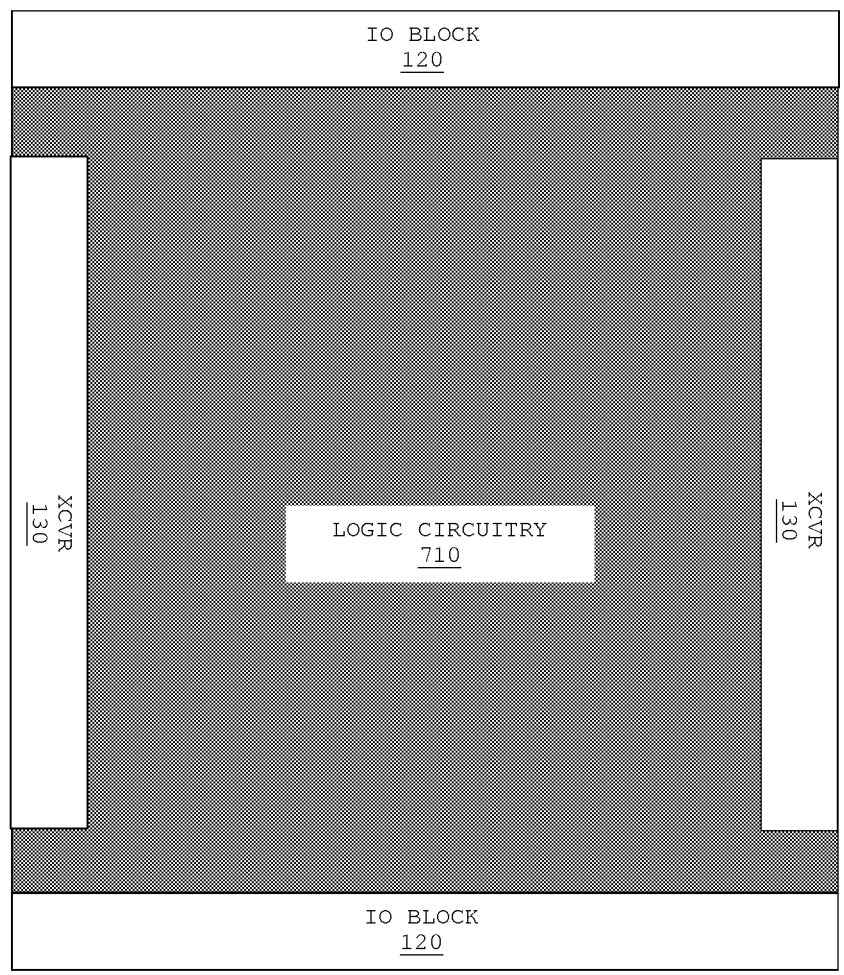
FIG. 7 shows an illustrative integrated circuit with input-output blocks extending to corners of the integrated circuit in accordance with one embodiment of the present invention.

FIG. 7, meant to be illustrative and not limiting, illustrates an integrated circuit with IO blocks extending towards corners of integrated circuit in accordance with one embodiment of the present invention. Integrated circuit 700 may be similar to integrated circuit 100 of FIG. 1 with IO blocks 120 extending to encompasses corner circuit 140 of FIG. 1. In one embodiment, the implementation of as shown in integrated circuit 700 may be suitable when there is no needs for corner circuit 140.

Referring still to FIG. 7, IO blocks 120 has one side overlapping with logic circuitry region 710. Transceiver blocks 130 are also located near integrated circuit 700 perimeter sides (i.e., left and right perimeter sides of integrated circuit 700). Both transceiver blocks 130 may have three sides surrounded by logic circuitry region 710.

Figure 8:
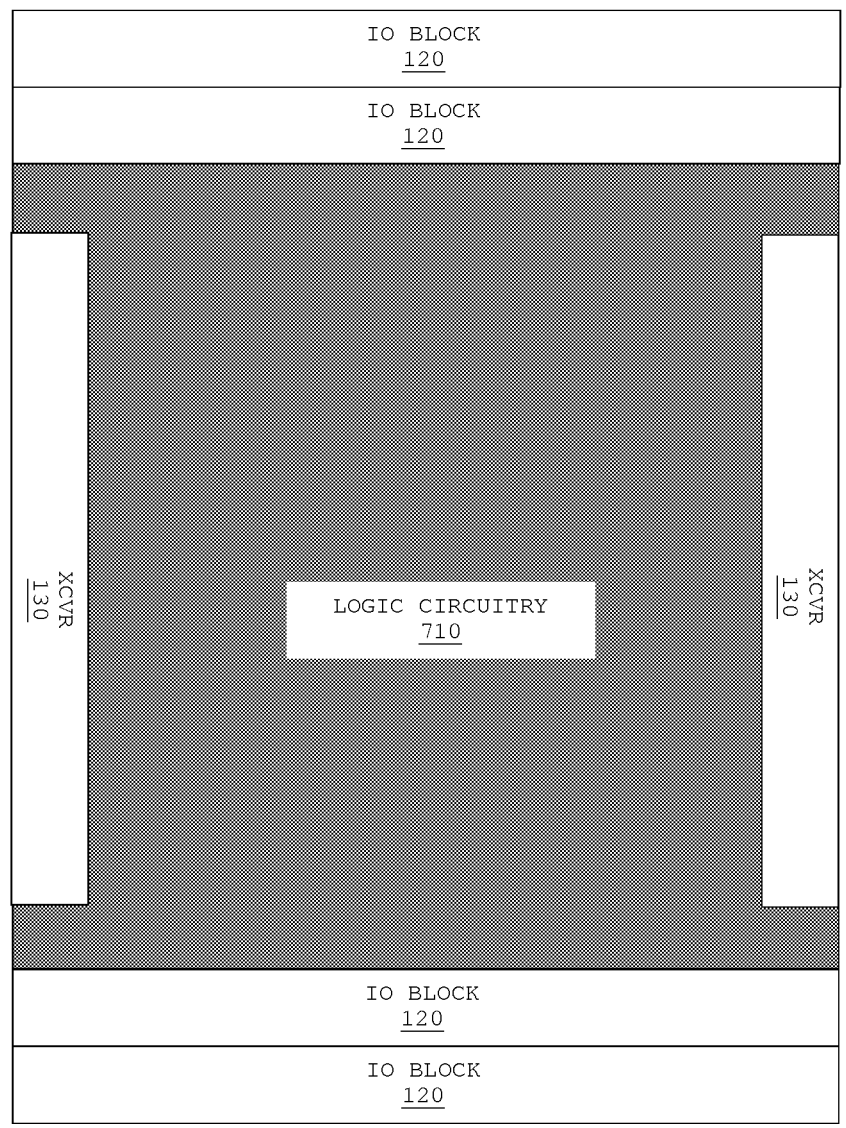
FIG. 8 shows an illustrative integrated circuit with stacked input-output blocks in accordance with one embodiment of the present invention.

FIG. 8, meant to be illustrative and not limiting, illustrates an integrated circuit with stacked IO blocks in accordance with one embodiment of the present invention. Integrated circuit 800 may be similar to integrated circuit 700 of FIG. 7 with two additional IO blocks 120, i.e., one additional IO block 120 is stacked above the top IO block 120 and another additional IO block 120 is stacked below the bottom IO block 120.

Referring still to FIG. 8, the additional IO blocks 120 has no sides that surrounds or overlaps logic circuitry region 710. Only one side of the additional IO blocks 120 is overlapped by the inner IO blocks 120. Such logic circuitry region 710 shapes may be utilized when a large number of IO blocks 120 is needed.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit, comprising:
   a first substantially rectangular region that includes interface circuitry, wherein the interface circuitry transfers signals in and out of the integrated circuit; and
   a second region that includes logic circuitry, wherein the logic circuitry implements a logic function, and wherein the second region surrounds the first substantially rectangular region from at least two sides.

2. The integrated circuit as defined in claim 1, wherein the interface circuit region includes a general purpose input-output (GPIO) circuit block.

3. The integrated circuit as defined in claim 1, wherein the interface circuit region includes transceiver circuitry.

4. The integrated circuit as defined in claim 1, further comprising:
   a third region that includes additional interface circuitry, wherein the additional interface circuitry transfers signals in and out of the integrated circuit, and wherein the second region surrounds the third region from at least two sides.

5. The integrated circuit as defined in claim 4, wherein the first substantially rectangular region has a perpendicular orientation relative to that of the third region on the integrated circuit.

6. The integrated circuit as defined in claim 1, wherein the second region surrounds the first substantially rectangular region from more than two sides.

7. The integrated circuit as defined in claim 1, wherein the second region surrounds the first substantially rectangular region from more than three sides.

8. The integrated circuit as defined in claim 1, further comprising:
   routing circuitry that is formed between the first and second regions.

9. An integrated circuit having at least one corner edge, comprising:
   a first interface circuit that communicates with external circuitry, wherein at least a portion of the first interface circuit is formed at the corner edge of the integrated circuit;
   a second interface circuit that is formed along another edge of the integrated circuit and adjacent to the corner edge; and
   logic circuitry formed along an entire edge of the first interface circuit.

10. The integrated circuit as defined in claim 9, wherein the first interface circuit comprises a general purpose input-output (GPIO) circuit.

11. The integrated circuit as defined in claim 9, wherein the first interface circuit comprises a transceiver circuit.

12. The integrated circuit as defined in claim 9, wherein the logic circuitry is formed along at least two sides of the second interface circuit.

13. The integrated circuit as defined in claim 12, wherein the logic circuitry is formed along three sides of the second interface circuit.

14. The integrated circuit as defined in claim 12, wherein the logic circuitry completely surrounds the second interface circuit from four sides.

15. An integrated circuit, comprising:
   an interface circuit that transfers signals between the integrated circuit and external circuitry; and
   logic circuitry wrapped around all sides of the interface circuit.

16. The integrated circuit as defined in claim 15, wherein the interface circuit is selected from a group of circuits consisting of: a general purpose input-output (GPIO) circuit and a high speed serial interface (HSSI) circuit.

17. The integrated circuit as defined in claim 15, further comprising:
   an additional interface circuit, wherein the logic circuitry is wrapped around at least two sides of the additional interface circuit, and wherein the interface circuit and the additional interface circuit are formed along different edges of the integrated circuit.

18. The integrated circuit as defined in claim 15, wherein a distance between any circuit within the interface circuit and a corresponding circuit within the logic circuitry is identical.

19. The integrated circuit as defined in claim 15, further comprising:
   routing circuitry interposed between the interface circuit and the logic circuitry.

* * * * *